US007534968B2

(12) United States Patent
English et al.

(10) Patent No.: US 7,534,968 B2
(45) Date of Patent: May 19, 2009

(54) SNAP INSTALL EMI SHIELDS WITH PROTRUSIONS AND ELECTRICALLY-CONDUCTIVE MEMBERS FOR ATTACHMENT TO SUBSTRATES

(75) Inventors: Gerald Robert English, Glen Ellyn, IL (US); Timothy M. Wrona, Crystal Lake, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 168 days.

(21) Appl. No.: 11/735,811

(22) Filed: Apr. 16, 2007

(65) Prior Publication Data
US 2008/0106884 A1 May 8, 2008

Related U.S. Application Data

(60) Provisional application No. 60/856,627, filed on Nov. 3, 2006.

(51) Int. Cl.
*H05K 9/00* (2006.01)
(52) U.S. Cl. .................. 174/382; 174/387; 361/818
(58) Field of Classification Search .......... 174/377, 174/382, 387; 361/816, 818
See application file for complete search history.

(56) References Cited

U.S. PATENT DOCUMENTS

| 5,398,156 A | 3/1995 | Steffes et al. |
| 5,414,597 A | 5/1995 | Lindland et al. |
| 5,476,387 A | 12/1995 | Ramey et al. |
| 5,477,421 A | 12/1995 | Bethurum |
| 5,508,889 A | 4/1996 | Ii |
| 5,566,055 A | 10/1996 | Salvi, Jr. |
| 5,673,172 A | 9/1997 | Hastings et al. |
| 5,726,867 A | 3/1998 | Zarreii |
| 6,049,469 A | 4/2000 | Hood, III et al. |
| 6,122,178 A | 9/2000 | Andrews et al. |
| 6,166,913 A | 12/2000 | Fun et al. |
| 6,195,267 B1 * | 2/2001 | MacDonald et al. ........ 361/800 |
| 6,313,400 B1 | 11/2001 | Mosquera et al. |
| 6,466,453 B2 | 10/2002 | Kobayashi |
| 6,608,251 B1 | 8/2003 | Nurmi |
| 7,113,410 B2 | 9/2006 | Pawlenko et al. |
| 2004/0001299 A1 | 1/2004 | van Haaster et al. |

FOREIGN PATENT DOCUMENTS

| WO | WO00/48440 | 8/2000 |
| WO | WO01/99483 | 12/2001 |

* cited by examiner

*Primary Examiner*—Hung V Ngo
(74) *Attorney, Agent, or Firm*—Harness, Dickey & Pierce, P.L.C.

(57) ABSTRACT

Various embodiments provide EMI shields for substrates having at least one electrical component disposed thereon. In one embodiment, an EMI shield generally includes a cover having first and second protrusions and at least one electrically-conductive member disposed along an inner side of the cover. The electrically-conductive member may be compressed generally between the substrate and the cover when the substrate is captured generally between the electrically-conductive member and the first protrusion. In addition, a compressive clamping force may be generated by the engagement of the first protrusion with the substrate and the compression of the electrically-conductive member. This compressive clamping force may mechanically retain the cover to the substrate, and also compress the electrically-conductive member against at least one electrically-conductive surface disposed on the substrate, to establish electrical conductivity therebetween that is sufficient for EMI shielding performance.

18 Claims, 13 Drawing Sheets

SNAP INSTALL EMI SHIELDS WITH PROTRUSIONS AND ELECTRICALLY-CONDUCTIVE MEMBERS FOR ATTACHMENT TO SUBSTRATES

CROSS-REFERENCE TO RELATED APPLICATION

This application claims the benefit of U.S. Provisional Application No. 60/856,7627 filed Nov. 3, 2006, the disclosure of which is incorporated herein by reference.

FIELD

The present disclosure generally relates to snap install EMI shields for shielding components of a printed circuit board from electromagnetic interference (EMI)/radio frequency interference (RFI).

BACKGROUND

The statements in this section merely provide background information related to the present disclosure and may not constitute prior art.

Electronic equipment typically includes electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, thereby rendering the electronic equipment inefficient or inoperable. Accordingly, the circuits (sometimes referred to as RF modules or transceiver circuits) usually require EMI/RFI shielding in order to function properly. Such shielding reduces interference not only from external sources, but also from various functional blocks within the module.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

By way of example, electronic circuits or components of a printed circuit board (PCB) are often enclosed with shields to localize EMI within its source, and to insulate other devices proximal to the EMI source. Such shields may be soldered or otherwise affixed to the PCB, thus increasing the overall size of the PCB. Soldered shields, however, may need to be removed to repair or replace a covered component, which can be an expensive and time-consuming task that may even cause damage to the PCB.

SUMMARY

According to various aspects, exemplary embodiments are provided of EMI shields operable for providing EMI shielding for electrical components on substrates, such as printed circuit boards, etc. In one exemplary embodiment, an EMI shield generally includes a cover having first and second protrusions and at least one electrically-conductive member disposed along an inner side of the cover. The electrically-conductive member may be compressed generally between the substrate and the cover when the substrate is captured generally between the first protrusion and the compressed electrically-conductive member with the first protrusion abutting against the substrate. In addition, a compressive clamping force may be generated by the engagement of the first protrusion with the substrate and compression of the electrically-conductive member. This compressive clamping force may mechanically retain the cover to the substrate, and also compress the electrically-conductive member against at least one electrically-conductive surface disposed on the substrate, to establish electrical conductivity therebetween that is sufficient for EMI shielding performance.

Some embodiments also include a second cover having first and second protrusions and at least one electrically-conductive member disposed along an inner side of the second cover. The second cover is attachable to the substrate for shielding one or more electrical components on a second side of the substrate. In these embodiments, the two covers may thus be used for providing EMI shielding for electrical components on both sides of the substrate.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 5:
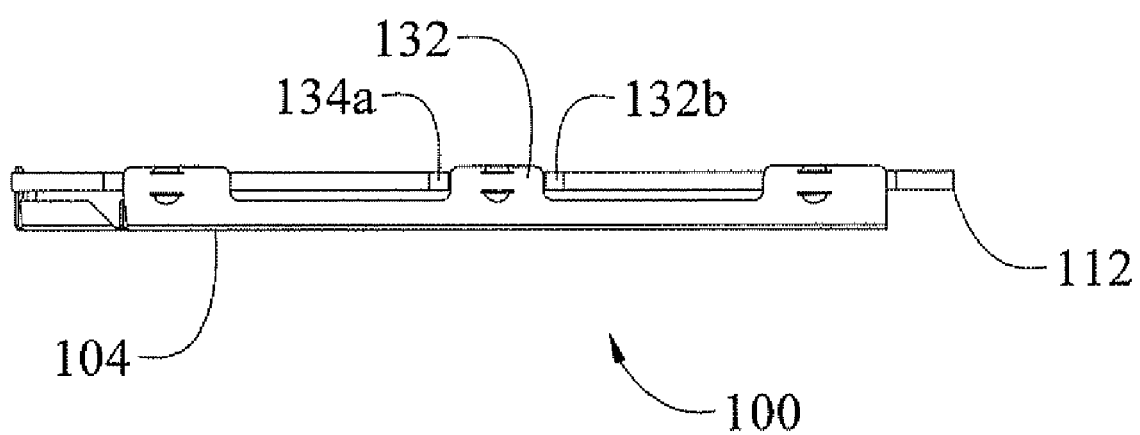
FIG. 5 is a front elevation view of the EMI shield installed to the printed circuit board as shown in FIG. 4.
Figure 6:
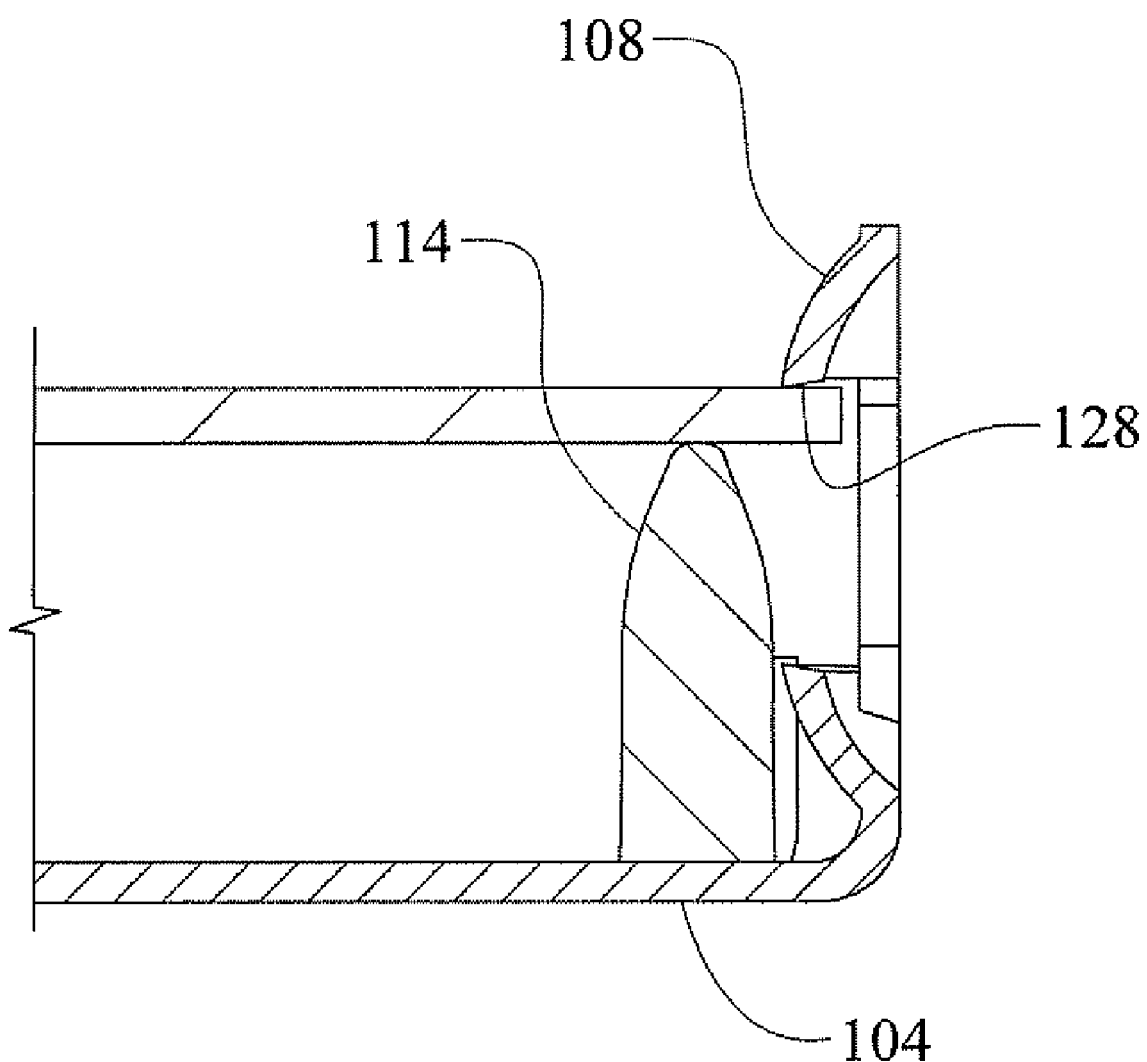
Figure 7:
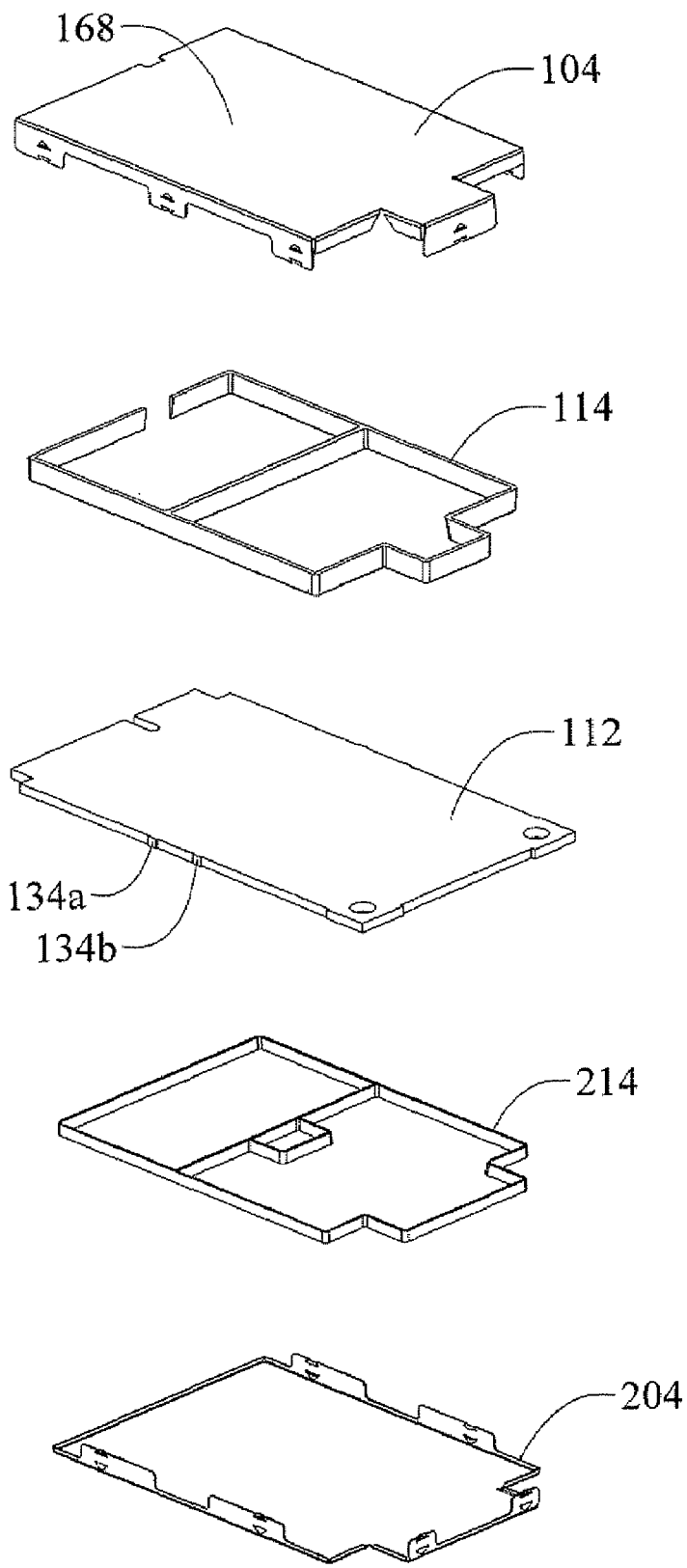
Figure 8:
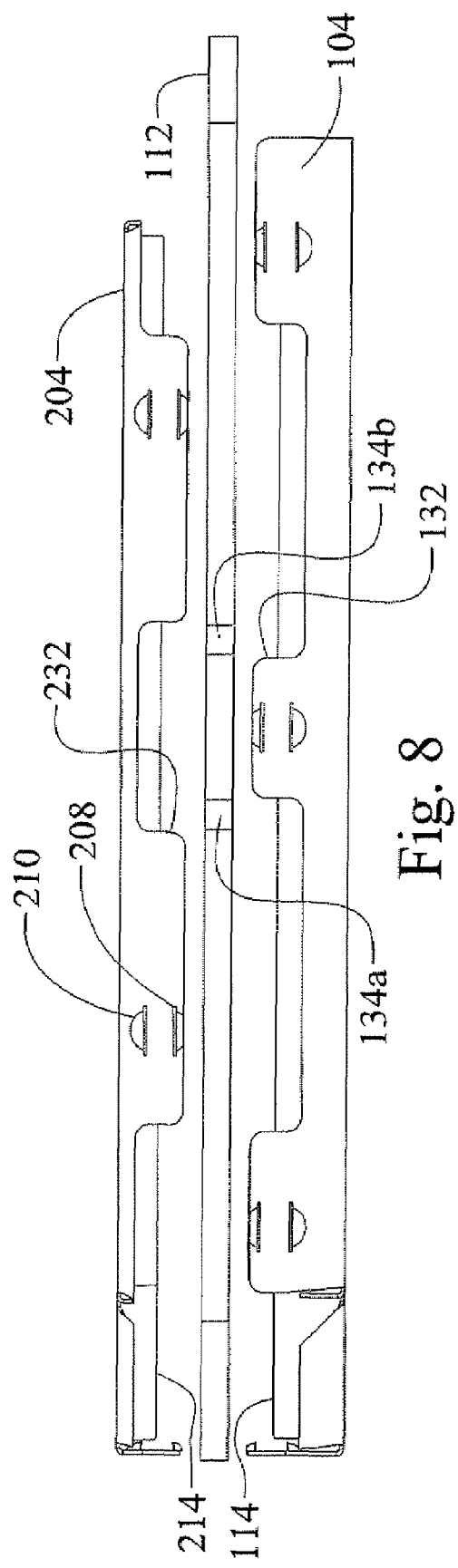
Figure 9:
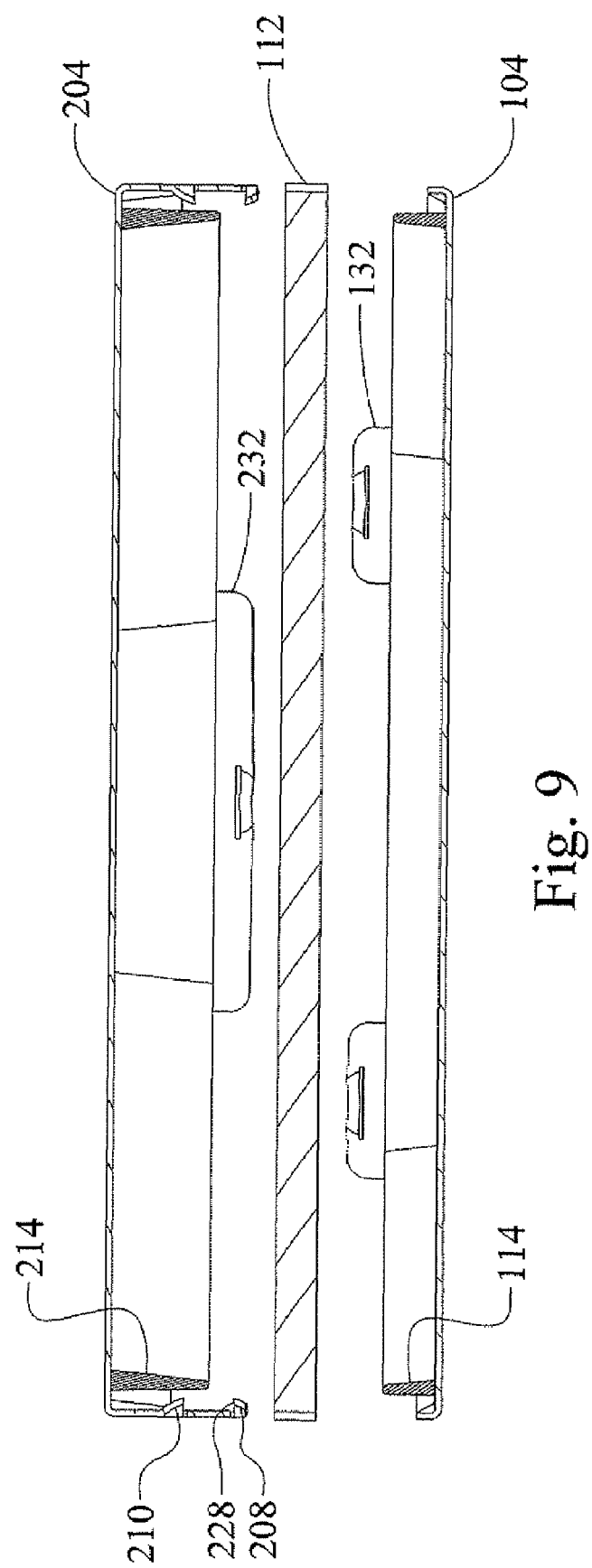
Figure 10:
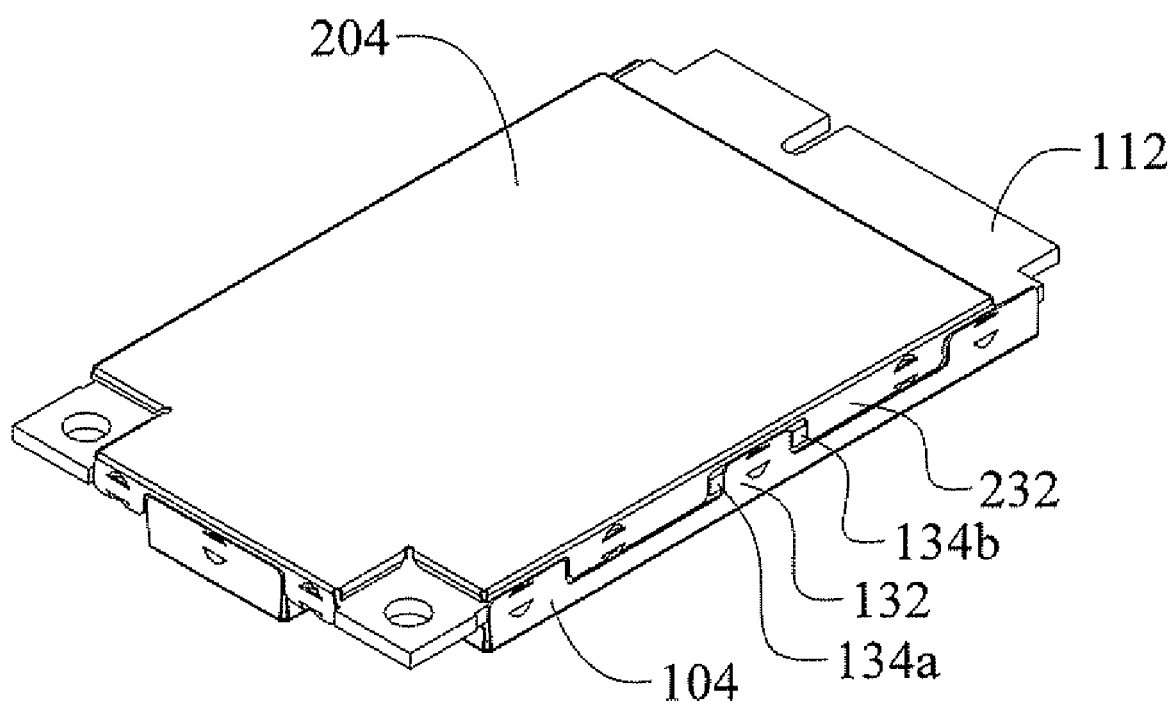
Figure 11:
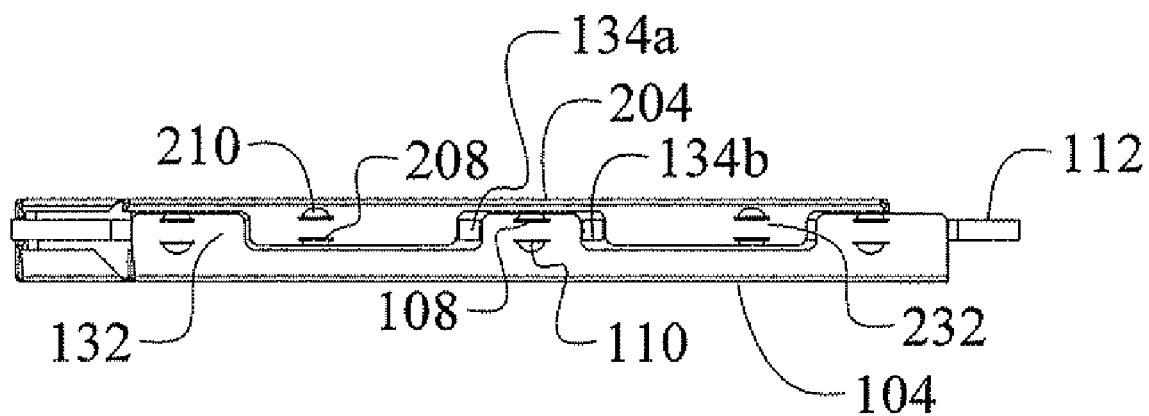
Figure 12:
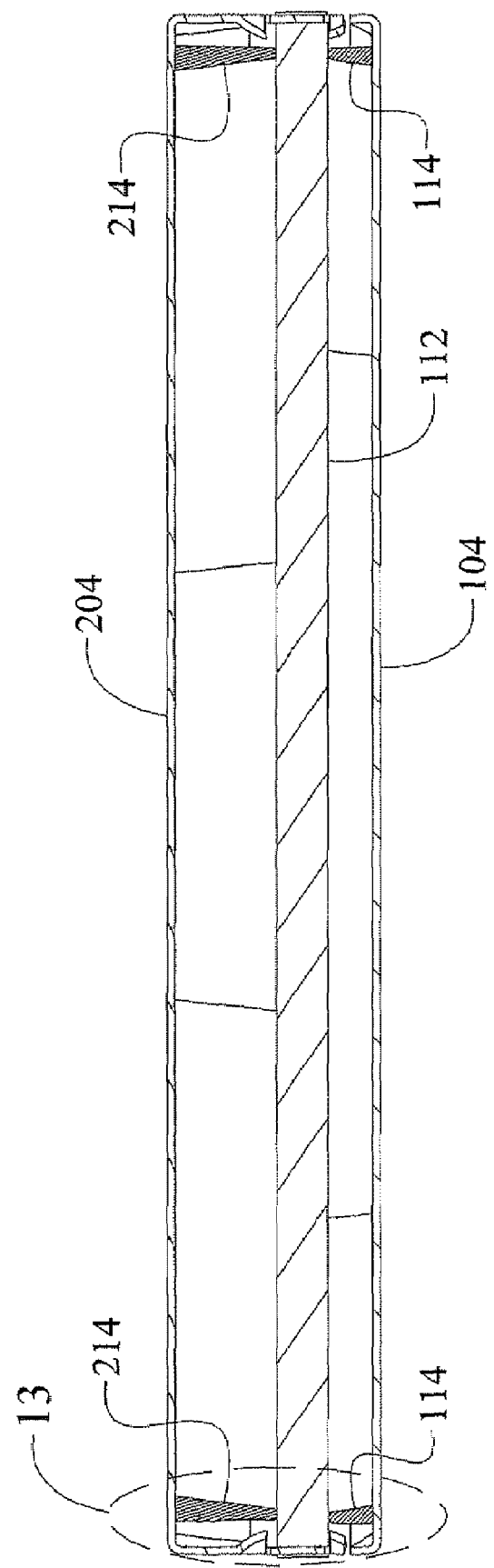
Figure 13:
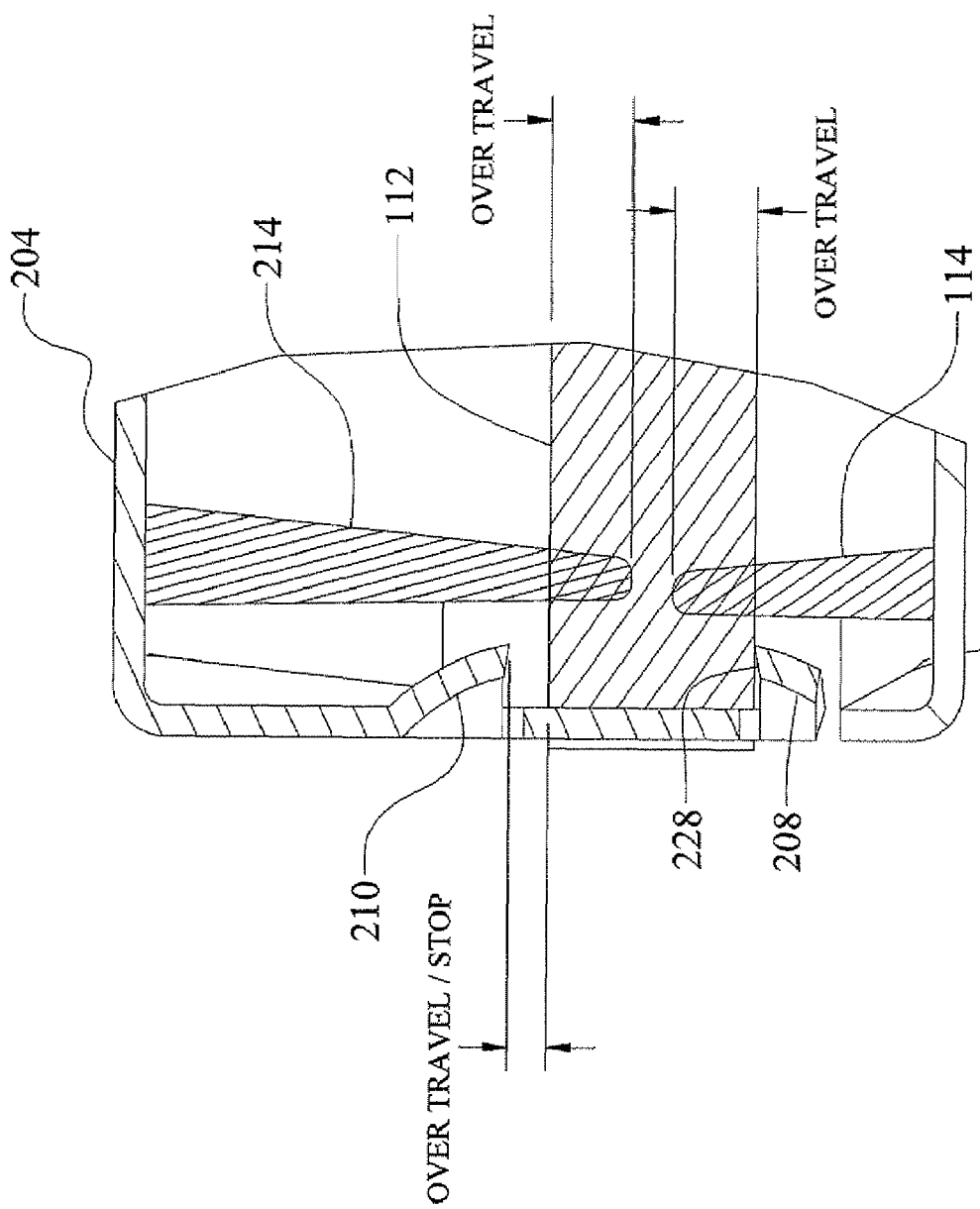

FIG. 6 is a partial cross-sectional view of the EMI shield shown in FIG. 5, and illustrating the exemplary manner in which the printed circuit board is captured generally between first protrusion and the compressed electrically-conductive member, whereby a compressive clamping force is generated for mechanically retaining the cover to the substrate and for compressing the electrically-conductive member against one or more electrically-conductive surfaces disposed on the substrate, to establish electrical conductivity sufficient for EMI shielding performance;

FIG. 7 is an exploded perspective view of an exemplary EMI shielding assembly that includes first and second covers having protrusions and electrically-conductive members, and illustrating the first and second covers respectively positioned on opposite sides of an exemplary printed circuit board;

FIG. 8 is a front elevation view of the EMI shielding assembly shown in FIG. 7 aligned for engagement with the printed circuit board;

FIG. 9 is a cross-sectional view of the EMI shielding assembly and printed circuit board shown in FIG. 8;

FIG. 10 is a perspective view of the EMI shielding assembly shown in FIG. 8 after the first and second covers have been installed to the printed circuit board along the respective first and second sides thereof to thereby provide EMI shielding for electrical components on both sides of the printed circuit board;

FIG. 11 is a front elevation view of the EMI shielding assembly installed to the printed circuit board as shown in FIG. 10;

FIG. 12 is a cross-sectional view of the EMI shielding assembly shown in FIG. 11, and illustrating the exemplary manner in which the first and second covers are mechanically retained to the substrate by compressive clamping forces generated by the compressed electrically-conductive members and the engagement of the covers' first protrusions with the substrate; and FIG. 13 is a partial cross-sectional view of the portion of the EMI shielding assembly designated 13 in FIG. 12 with the electrically-conductive members shown uncompressed for clarity in order to better illustrate the relative sizing and over travel according to exemplary embodiments.

DETAILED DESCRIPTION

The following description is merely exemplary in nature and is in no way intended to limit the present disclosure, application, or uses. It should be understood that throughout the drawings, corresponding reference numerals indicate like or corresponding parts and features.

According to various aspects, exemplary embodiments are provided of EMI shields operable for providing EMI shielding for electrical components on substrates, such as printed circuit boards. In one exemplary embodiment, an EMI shield generally includes a cover having first and second protrusions (e.g., catches, snaps, latches, tabs, detents, protuberances, ribs, ridges, ramp-ups, darts, lances, dimples, half-dimples, combinations thereof, etc.). At least one electrically-conductive member (e.g., resilient electrically-conductive member, flexible electrically-conductive member, electrically-conductive elastomeric member, electrically-conductive molded portion, etc.) is disposed along an inner side of the cover. The at least one electrically-conductive member may be compressed when the substrate is captured generally between the first protrusion and the at least one electrically-conductive member. In addition, a compressive clamping force may be generated by the engagement of the first protrusion with the substrate and compression of the at least one electrically-conductive member. This compressive clamping force may mechanically retain the cover to the substrate, and also compress the at least one electrically-conductive member against at least one electrically-conductive surface disposed along the substrate, to establish electrical conductivity sufficient for EMI shielding performance.

In some embodiments, the substrate (e.g., printed circuit board, etc.) is notched or includes protruding portions for preventing (or at least inhibiting) relative longitudinal sliding movement of the cover along the substrate. In these embodiments, at least a portion of the cover (e.g., a tab or wall portion of the cover, etc.) may be positioned or captured generally between a pair of spaced-part protruding portions of the substrate. In this exemplary manner, contact between the cover's tab with the substrate's first protruding portion inhibits the cover from sliding in a first direction along the substrate, whereas contact between the cover's tab with the substrate's second protruding portion inhibits the cover from sliding in a second direction along the substrate. Alternatively, or additionally, the cover or substrate may be provided with at least one pin or tab that is engagingly received with a corresponding opening defined by the other one of the cover or the substrate. In such alternative embodiments, the engagement of the pin/tab with the opening would thus inhibit sliding movement of the cover along the substrate. In still other embodiments, the cover and the substrate may cooperatively define other means for inhibiting sliding of the cover relative to the substrate.

Some embodiments also include a second cover having first and second protrusions and at least one resilient electrically-conductive member disposed along an inner side of the second cover. The second cover is attachable to the substrate for shielding one or more electrical components on a second side of the substrate. In these embodiments, the two covers may thus be used for providing EMI shielding for electrical components on both sides of the substrate.

In addition, the second cover may be attachable to the substrate by positioning the second cover relative to the substrate so as to compress the second cover's electrically-conductive member and to capture the substrate generally between the second cover's first protrusion and compressed electrically-conductive member. The compression of the electrically-conductive member associated with the second cover may preferably produce a sufficient contact pressure effective for establishing at least a certain or desirable level (e.g., minimal level in some embodiments, etc.) of electrical conductivity between the second cover and at least one conductive surface (e.g., traces, etc.) on the substrate via the electrically-conductive member. When compressed, the electrically-conductive members associated with both the first and second covers may cooperatively generate a sufficient clamping force in combination with the first protrusions, to mechanically retain the covers to the substrate.

Additional aspects relate to methods of using EMI shields. Other aspects relate to methods of making EMI shields.

Advantageously, various embodiments disclosed herein may provide low-profile EMI shields that have a reduced height (as compared to some existing EMI shields), whereby the reduced height allows for installation or use within less physical space. Some embodiments may also provide dual-sided board shielding by readily removable covers, thereby also providing dual-sided electrical component access. Exemplary embodiments provide EMI shields that are capable of being attached directly to substrates (e.g., pressed or snapped onto a printed circuit board, etc.) without having to use mechanical fasteners, frames, or tools. This, in turn, may allow for reduced part counts and relatively easy assembly and installation of an EMI shield to a substrate.

FIGS. 1 through 6 illustrate an exemplary EMI shield 100 embodying one or more aspects of the disclosure. The EMI shield 100 includes a cover 104 having sidewalls 106, first protrusions 108, and second protrusions 110. As shown in FIG. 6, the first and second protrusions 108 and 110 of each corresponding pair are sufficiently spaced apart from each other to allow an edge portion of the substrate 112 to be positioned generally therebetween.

Figure 2:
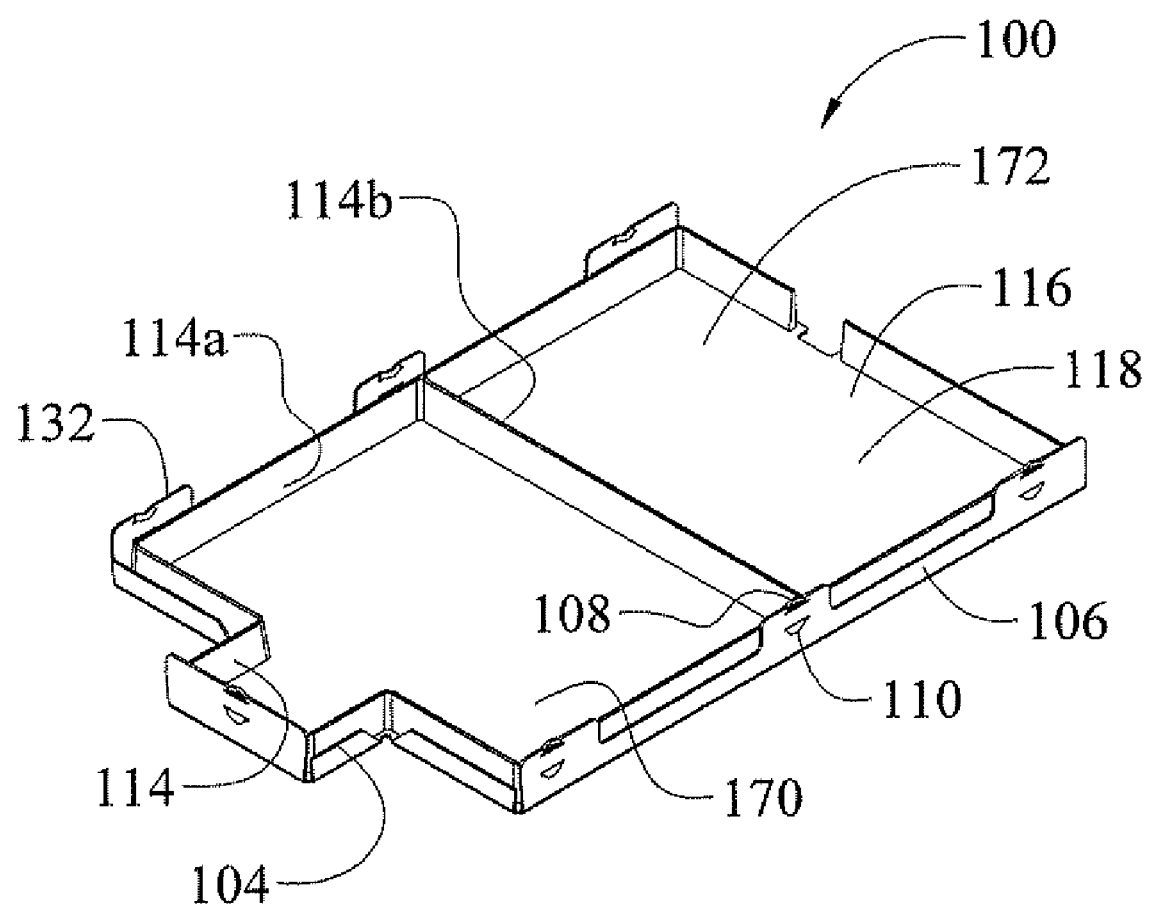
FIG. 2 is an inner perspective view of the EMI shield shown in FIG. 1 and illustrating the electrically-conductive member disposed along an inner side of the cover according to exemplary embodiments.

With continued reference to FIG. 2, an electrically-conductive member 114 is disposed along an inside 116 of the cover's generally planar surface 118. In the illustrated embodiment, the electrically-conductive member 114 comprises electrically-conductive elastomer molded material 114a, 114b, The electrically-conductive elastomer molded material 114a is disposed along the cover's entire perimeter adjacent the cover's sidewalls 106. The electrically-conductive molded material 114b is disposed transversely across the cover 104. Alternatively, the electrically-conductive member 114 may comprise other materials and/or be positioned at other locations (e.g., spaced away from the cover's sidewalls, disposed along less than the cover's entire perimeter, disposed only along the cover's perimeter without any transverse portions, etc.).

Figure 3:
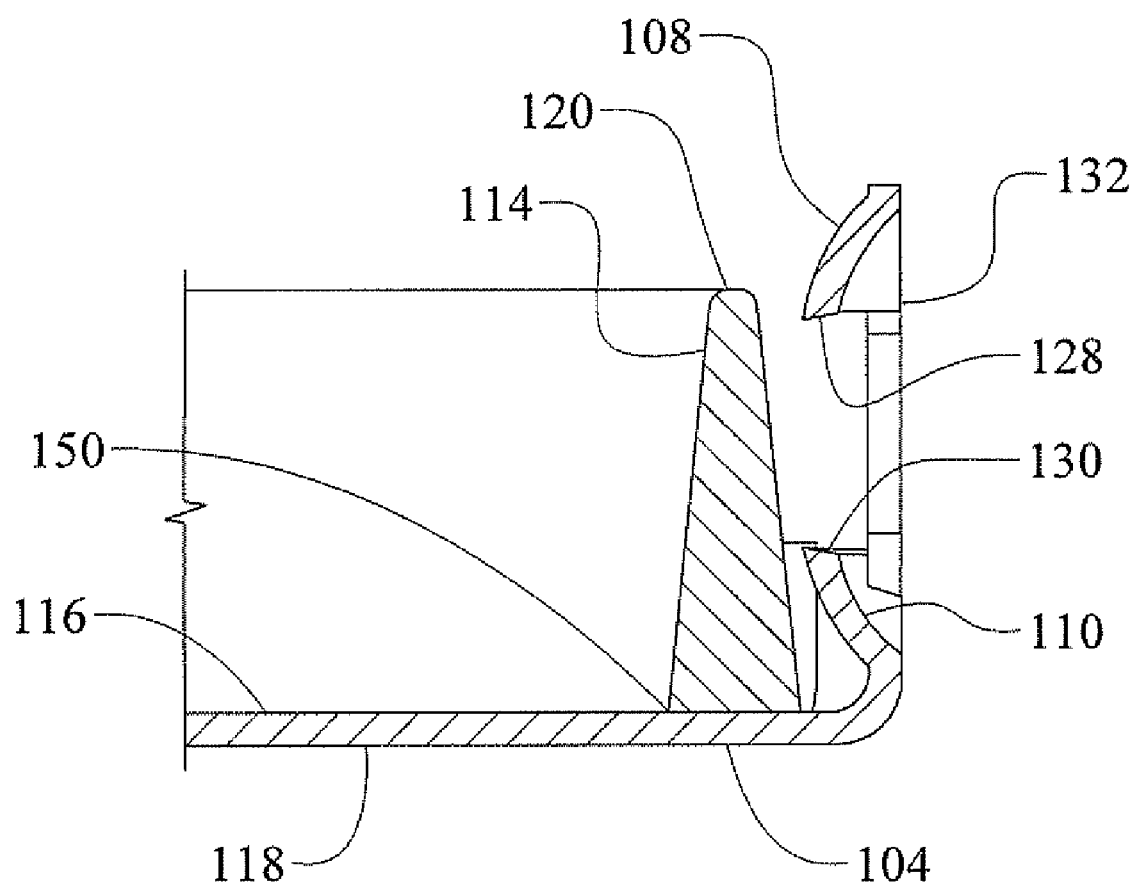
FIG. 3 is a partial cross-sectional view of an EMI shield having an electrically-conductive member with a free end portion that (when uncompressed or free-standing) is located beyond and farther away from the cover's inner side than the detent or engagement surface of the first protrusion according to exemplary embodiments.

In some embodiments such as the exemplary embodiment shown in FIG. 3, the electrically-conductive member 114 is configured (e.g., dimensioned, etc.) to have a height greater than the distance between the substrate to which the cover 104 will be attached and the cover's inner surface 116. In such embodiments, the free end portion 120 of the electrically-conductive member 114 (when uncompressed) is farther away from the cover's inner surface 116 than the detent or engagement surface 128 of the first protrusion 108. As shown in FIG. 6, this relative sizing allows for relatively significant compression of the electrically-conductive member 114 when the substrate 112 is captured generally between the first protrusion 110 and the compressed electrically-conductive member 114 with the detent 128 of the first protrusion 108 abutting against the substrate 112. In other embodiments such as the exemplary embodiments shown in FIGS. 2 and 9, the electrically-conductive member 114 may be configured (e.g., dimensioned, etc.) such that its free end portion 120 is located generally between the first and second detents 108, 110 when the electrically-conductive member 114 is uncompressed. As shown in FIG. 12, this relative sizing also allows for compression of the electrically-conductive member 114 when the substrate 112 is captured generally between the first protrusion 110 and the compressed electrically-conductive member 114 with the detent 128 of the first protrusion 108 abutting against the substrate 112. The extent of the compression needed for the electrically-conductive member 114 may vary depending, for example, on the particular application. Preferably, the electrically-conductive member 114 is sufficiently compressed so as to produce adequate contact pressure effective for establishing at least a certain or desirable level (e.g., minimal level in some embodiments, etc.) of electrical conductivity between the cover 104 and at least one conductive surface (e.g., traces, etc.) on the board via the electrically-conductive member 114.

When disposed over one or more electrical components of a circuit board, for example, the EMI shield 100 provides EMI shielding of the electronic component(s). The EMI shield 100 is capable of shielding electronic component(s) from EMI/RFI emitted from other electronic components, and/or inhibiting EMI/RFI emitted by the electronic component(s) from interfering with other components. The EMI shield 100 may be used with a wide range of electronic components and packages, such as integrated circuits mounted on a printed circuit board, etc.

The cover 104 is preferably configured to be releasably attached to the substrate 112, in a manner that permits the cover 104 to be fairly easily removed and snapped back onto the substrate. As disclosed herein, the cover's protrusions 108 and electrically-conductive member 114 may allow the EMI shield 100 to be pressed or snapped directly onto the substrate 112 without having to use mechanical fasteners, frames, or tools. In addition, the first cover 104 may also allow for ready removal thereof, for example, to access electrical components of the substrate 112. By way of example, the cover 104 may be removed from the substrate 112 by using an implement (e.g., tweezers, flat screwdriver, metal pick, fingernail, or other suitable device) to pry a tab 132 having the protrusion 108 away from the substrate 112. This action will rotate the tab 132 until the edge 128 of the protrusion 108 clears the edge of the substrate 112. With the protrusion 108 no longer engaged with the substrate 112, the mechanical clamping force would be released. This exemplary process may then need to be repeated at each tab 132 of the cover 104. The cover 104 may or may not be reusable after removal depending, for example, on the particular embodiment.

Figure 4:
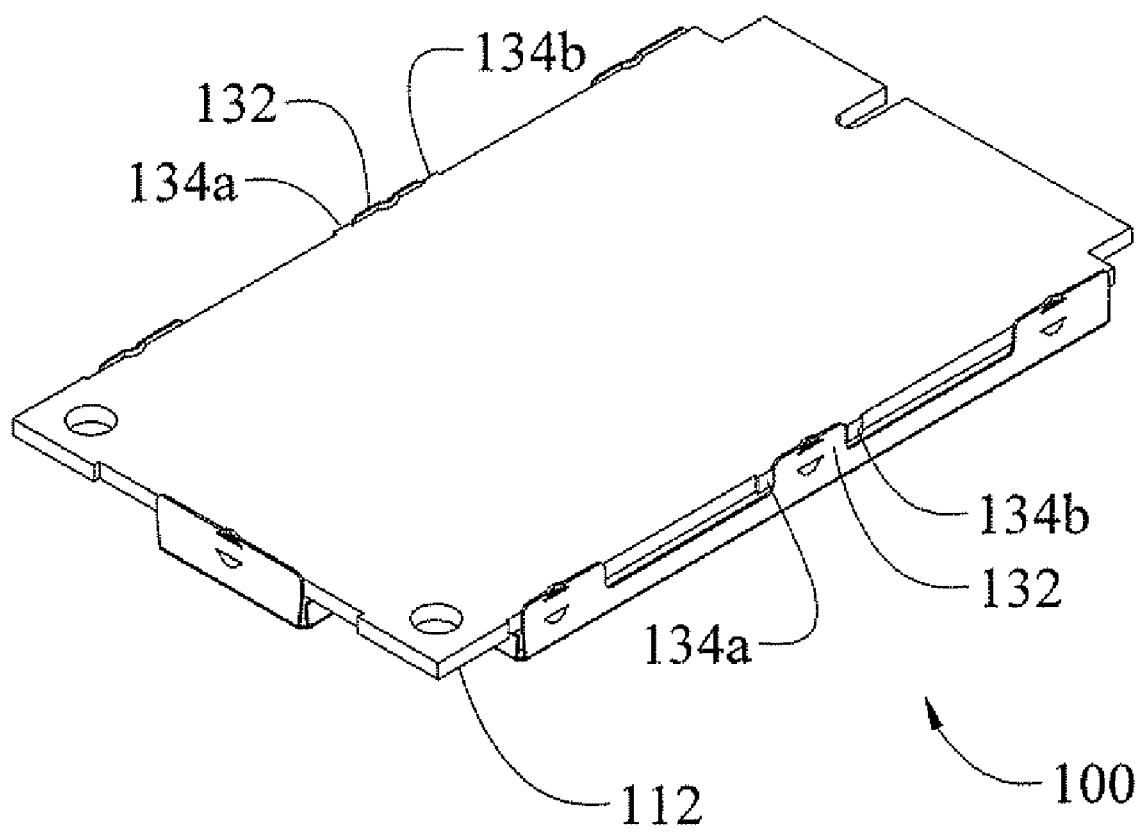
FIG. 4 is a perspective view of the EMI shield shown in FIG. 1 after the EMI shield has been installed to an exemplary printed circuit board to thereby provide EMI shielding for electrical components on a first side of the printed circuit board.

In the illustrated embodiment, the cover 104 includes tabs 132 having inwardly-extending half dimples defining the protrusions 108, 110. As shown in FIGS. 4 and 5, at least one of the cover's tabs 132 (the middle tabs in this particular embodiment) may be positioned or captured generally within a notched portion of the substrate 112. For this exemplary embodiment, the substrate 112 includes a pair of spaced-apart protruding portions 134a, 134b along both longitudinal edges of the substrate 132. Each pair of protruding portions 134a, 134b is configured for receiving or capturing a corresponding tab 132 of the cover 104, such that contact between the cover's tab 132 with the substrate's first protruding portion 134a inhibits the cover 104 from sliding in a first direction along the substrate 112, and such that contact between the cover's tab 132 with the substrate's second protruding portion 134b inhibits the cover 104 from sliding in a second direction along the substrate 112. Alternatively, or additionally, the cover or substrate may be provided with at least one pin or tab that is engagingly received with a corresponding opening defined by the other one of the cover or the substrate. In such alternative embodiments, the engagement of the pin/tab with the opening would thus inhibit sliding movement of the cover along the substrate. In still other embodiments, the cover and the substrate may cooperatively define other means for inhibiting sliding of the cover relative to the substrate.

As shown in FIG. 3, the half dimples define detent or engagement surfaces 128, 130 of the respective first and second protrusions 108, 110. The detent surfaces 128 of the half-dimple first protrusions 108 are configured to engage the substrate 112, as shown in FIG. 6.

The lower portions of the half-dimple first protrusions 108 may also function or operate as camming surfaces. During the installation process, contact between the rounded lower portion of the inwardly extending half-dimples and the substrate 112 may urge the tabs 132 generally outwardly. Accordingly, this camming feature may thus facilitate positioning of the first protrusions 108 from one side of the substrate 112 across the width of the substrate 112 to the other side of the substrate 112 for engagement therewith.

The second protrusions 110 are preferably configured so as to be operable as stops for inhibiting relative movement of the cover 104 towards the substrate 112 beyond a predetermined amount, for example, to help prevent (or at least inhibit) over-compression of the electrically-conductive member 114. Accordingly, contact between the substrate 112 and the detent surfaces 130 of the second protrusions 110 will inhibit any further movement of the cover 104 towards the substrate 112. This, in turn, may provide a tactile indication to the installer that the cover 104 has been fully snapped or installed onto the substrate 112. In which case, the installer should stop pushing or otherwise applying pressure to the cover 104 towards the substrate 112.

Alternatively, the cover 104 may include other means besides the half-dimples 108, 110 for engaging the substrate, such as protuberances, catches, snaps, latches, tabs, detents, ribs, ridges, ramp-ups, darts, lances, full dimples, combinations thereof, etc. In addition, other embodiments include a cover that includes only first protrusions without any second protrusions for inhibiting over-compression.

Figure 1:
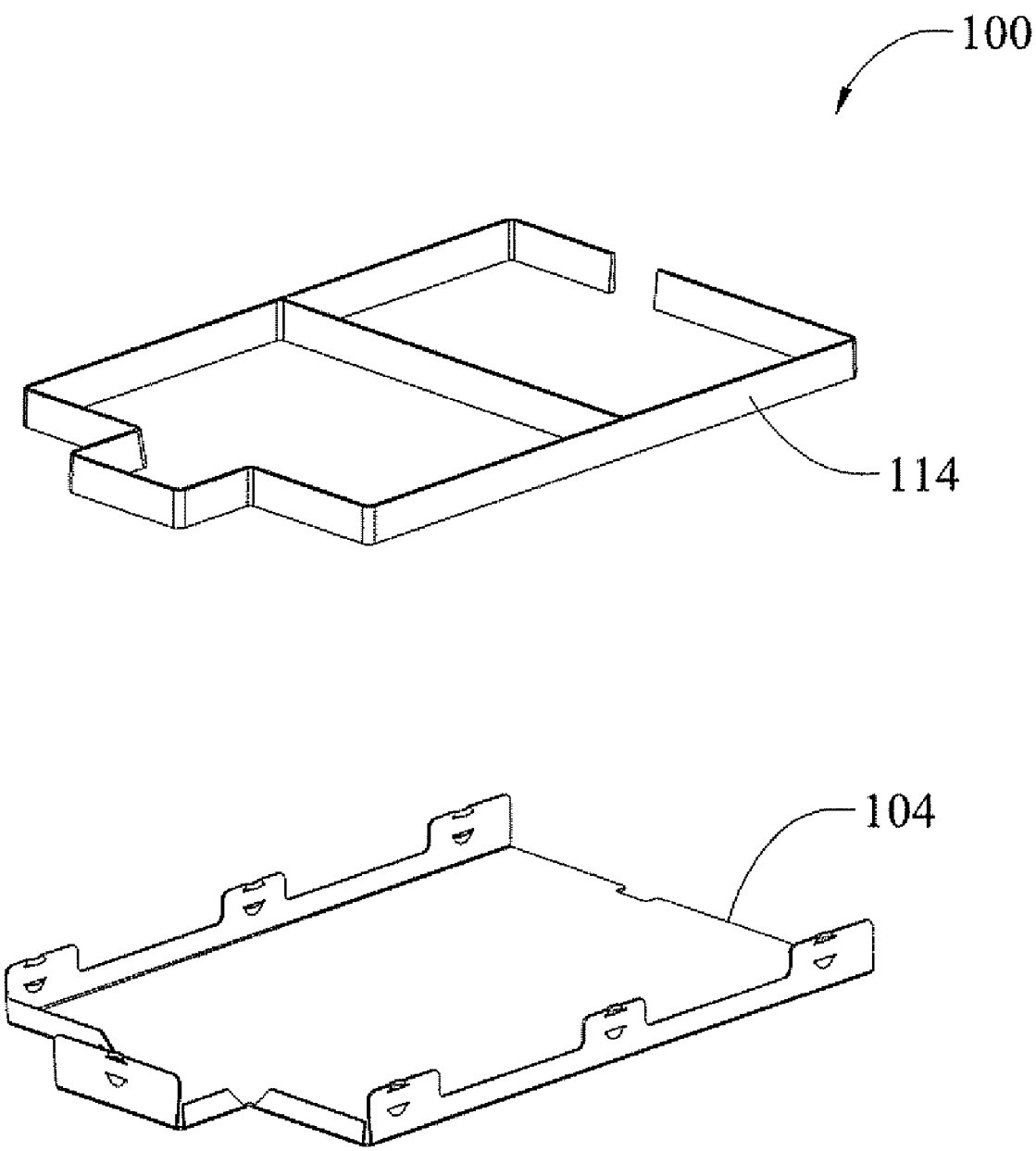
FIG. 1 is an exploded perspective view of an EMI shield that includes a cover having protrusions and an electrically-conductive member according to exemplary embodiments.

In various embodiments, the cover 104 may be integrally or monolithically formed as a single component. In this particular embodiment, the cover 104 may be formed by stamping in a piece of material a flat profile pattern for the cover 104. For the particular illustrated embodiment, the stamped profile for the cover 104 includes the protrusions 108, 110 and tabs 132. After stamping the flat pattern profile for the cover 104 into the piece of material, the wall portions 106 may then be folded, bent, or otherwise formed so as to be generally perpendicular as shown in FIG. 1. In some embodiments, the cover's sidewalls, wall portions, tabs, protrusions, etc. are formed, bent, folded, or otherwise shaped before the electrically-conductive member is provided along the cover's inside portion. In other embodiments, the electrically-conductive member may be provided along the cover's inside portion before forming, bending, folding, or otherwise shaping the cover's side walls, wall portions, tabs, protrusions, etc. Even though the cover 104 may be formed integrally as described for this example, such is not required for all embodiments. For example, other embodiments may include tabs, wall portions, and/or protuberances that are discrete components separately attached to the cover 104, for example, by welding, adhesives, among other suitable methods. Alternative configurations (e.g., shapes, sizes, etc.), materials, and manufacturing methods (e.g., drawing, etc.) may also be used for making the cover 104.

A wide range of materials may be used for the cover 104, such as sheet metal, nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically-conductive. In one exemplary embodiment, a cover 104 is formed from a sheet of nickel silver alloy having a thickness of about 0.13 millimeters. In another exemplary embodiment, a cover 104 is formed from a sheet of stainless steel having a thickness of about 0.15 millimeters (with a tolerance of +/−0.02 millimeters). The materials and dimensions provided herein are for purposes of illustration only, as the assembly and components thereof may be configured from different materials and/or with different dimensions depending, for example, on the particular application, such as the component to be shielded, space considerations within the overall apparatus, EMI shielding and heat dissipation needs, and other factors.

The cover 104 may be configured to allow for handling by pick-and-place equipment (e.g., vacuum pick-and-place equipment, etc.). For example, FIG. 7 shows a pick-up area 168 on the cover 104. The pick-up area 168 may facilitate handling of the cover 104, for example, during fabrication of the cover 104 through a progressive die stamping process. Alternatively, other manufacturing methods can also be used for making the cover 104.

In some embodiments, one or more ribs may be added to the cover to provide increased stiffness. The ribs may be integrally formed in the cover, or they may be formed in other ways. In either case, the ribs may be configured to help stiffen or reinforce the generally planar top portion of the cover, for example, to maintain the cover's top portion in a generally straight, planar configuration. The ribs, together with electrically-conductive member disposed along an inside portion of the cover, may also cooperatively form or define one or more partitioned EMI shielding areas or compartments. The ribs may also provide means for locating or affixing electrically-conductive material on the inner side of the cover, which accordingly may provide for establishing partitioned areas under the cover. Alternative embodiments may include a cover without any such ribs or stiffeners.

FIGS. 1 through 6 illustrate the cover 104 according to particular exemplary embodiments. Alternative embodiments may include a cover having more or less peripheral walls and/or peripheral walls in a different configuration (e.g., rectangular configurations, non-rectangular configurations, triangular, hexagonal, circular, other polygonal shapes, etc.) than what is shown in the figures, etc. Further embodiments may include peripheral walls having more or less protuberances than what are disclosed in the figures.

With further reference to FIGS. 1 and 2, the electrically-conductive member 114 is disposed on the inner surface 116 of the cover 104. Preferably, the electrically-conductive member 114 is resiliently compressible. The electrically-conductive member 114 may be formed from material dispensed onto (e.g., via form-in-place dispensing equipment, handheld dispenser or caulk gun, etc.), molded onto (e.g., over-molded, etc.), or attached (e.g., adhesively bonded, etc.) to various portions of the cover 104. By way of example only, the electrically-conductive member 114 may be dispensed onto the cover 104, or the electrically-conductive member 114 may be over-molded onto the cover 104 through an insert-molding process.

The cover may also include one or more through-holes, which may be used for injection molding of elastomer from the top side (after the cover is inserted into a mold) and then through the hole. This, in turn, may allow elastomer to be injection molded without any parting or injection lines in some embodiments.

The electrically-conductive member 114 may be formed from various materials. In some preferred embodiments, the member 114 is formed from elastomeric materials filled with electrically-conductive particles. Examples of preferred elastomeric materials include silicone, fluorosilicone, fluorocarbon, and Ethylene Propylene Diene Monomer [EPDM]. Thermoplastic elastomer can also be used as the elastomeric material. Examples of preferred electrically-conductive particles include silver coated glass particles, which can be used to make an elastomeric material electrically-conductive. In other embodiments, silver particles, silver coated copper particles, silver coated aluminum particles, silver plated nickel particles, nickel coated graphite particles, and graphite particles can also be used to make the elastomeric material electrically-conductive.

The electrically-conductive member 114 may be arranged in any number of configurations, and may be formed integrally or separately from other electrically-conductive members provided to the cover 104. For example, the electrically-conductive member 114 may comprise various individual portions that are separate from each other.

The electrically-conductive member 114 may have a non-uniform cross-section or profile. For example, FIG. 3 shows an electrically-conductive member 114 having a cross-section that generally reduces in width from the base portion 150 towards a free end portion 120.

In some embodiments, the member 114 may be thermally conductive (e.g., have a thermal conductivity coefficient greater than that of air alone, etc.) for creating a thermally-conducting heat path from the cover 104 to the substrate. In such embodiments, the member 114 may be configured to contact at least one electrically-conductive surface on the board from which to conduct heat, such as a grounding trace or a board-mounted electrical component. With this contact, the member 114 may facilitate transferring and/or thermally conducting of heat from the at least one electrically-conductive surface to the cover 104.

Some embodiments may include a thermal interface material disposed along an interior portion of the cover 104 for forming a thermally-conducting heat path from one or more electrical components of the board to the assembly. This thermal interface material may comprise the member 114 in some embodiments, or the thermal interface material may be in addition to, or as an alternative to, the member 114 in other embodiments. In either case, a wide variety of materials may be used for a thermal interface, which are preferably better thermal conductors and have higher thermal conductivities than air alone. Accordingly, the thermal interface (with its compressive contact against the electrical component) may thus allow for improved heat transfer from the electrical component to the cover 104 as compared to those designs relying solely upon air to define the heat path between the electrical component and the underside of the cover. Some preferred embodiments include a thermal interface formed from T-flex™600 series thermal gap filler material commercially available from Laird Technologies, Inc. of Saint Louis, Mo. In one particular preferred embodiment, a thermal interface comprises T-flex™ 620 thermal gap filer material, which generally includes reinforced boron nitride filled silicone elastomer. By way of further example, other embodiments include thermal interfaces molded from electrically-conductive elastomer. Additional exemplary embodiments include thermal interface materials formed from ceramic particles, ferrite EMI/RFI absorbing particles, metal or fiberglass meshes in a base of rubber, gel, grease or wax, etc. Alternative embodiments, however, can provide an assembly that does not include any such thermal interfaces.

In another exemplary aspect, the member 114 may intervene between one or more areas on a circuit board to partition one or more areas from other areas. The one or more areas partitioned by the member 114 may cooperatively form or define at least one EMI shielding compartment or enclosure. The member 114 may provide for an attenuation of transfer of electromagnetic (EMI) energy for each of the one or more partitioned areas, where that attenuation is at least minimally sufficient for EMI shielding applications. In the illustrated embodiment of FIG. 2, the electrically-conductive member 114 partitions at least a portion of the cover 104 into first and second areas or shielding compartments 170 and 172. Accordingly, the EMI shield 100 may thus accordingly be used to provide EMI shielding of one or more electrical components located within each partitioned area 170 and 172.

The electrically-conductive member 114 may also provide for contact with a smaller electrically-conductive surface (or minimum area in some embodiments). Having this reduced contact area with the conductive surface (such as circuit board traces, etc.) may help to reduce and/or provide an acceptable level of electrical impedance between the electrically-conductive surface and the cover.

As shown in FIGS. 7 through 12, some embodiments include a second cover 204 having first and second protrusions 208 and 210. As with cover 104, at least one electrically-conductive member 214 (FIG. 7) may also be disposed along an inner side of the second cover 204. As shown in FIG. 10, the first and second covers 104, 204 may be attached to the substrate 112 along opposite sides thereof to thereby provide EMI shielding for electrical components on both sides of the substrate.

In the illustrated embodiment, the cover 204 includes tabs 232 that are staggered or spaced accordingly so as to not interfere (e.g., contact, etc.) with the tabs 132 of the cover 104. With this staggering, the tabs 132 and 232 may thus be positioned so as to extend across the thickness of the substrate 112 as shown in FIG. 10.

As shown in FIG. 12, the cover 204 may be attached to the substrate 112 by positioning the cover 204 relative to the substrate 112 so as to capture the substrate 112 generally between the first protrusions 208 and the compressed electrically-conductive member 214. The compression of the electrically-conductive member 214 preferably produces a sufficient contact pressure effective for establishing at least a certain or desirable level (e.g., minimal level in some embodiments, etc.) of electrical conductivity between the cover 204 and at least one conductive surface (e.g., traces, etc.) on the substrate 112 via the electrically-conductive member 214. In addition, the compression of the electrically-conductive members 114 and 214 may cooperate to generate a sufficient clamping force to mechanically retain the covers 104, 204 to the substrate 112.

The first and second covers 104, 204 may also allow for ready removal thereof, thereby enabling dual-sided electrical component access. By way of example, either or both covers 104, 204 may be removed from the substrate 112 by using an implement (e.g., tweezers, flat screwdriver, metal pick, fingernail, or other suitable device) to pry a side tab 132, 232 having the capturing protrusions 108, 208 away from the substrate 112. This action will rotate the tab until the edge 128, 228 of the protrusion 108, 208 clears the edge of the substrate 112. With the protrusion 108, 208 no longer engaged with the substrate 112, the mechanical clamping force would be released. This exemplary process may then need to be repeated at each tab 132, 232 of the corresponding cover 104, 204. Either or both covers 104, 204 may or may not be reusable after removal depending, for example, on the particular embodiment.

Referring now to FIG. 13, there is shown a partial cross-sectional view of the substrate 112, first and second covers 104, 204, and electrically-conductive members 114, 214. In FIG. 13, the electrically-conductive members 114, 214 have been shown uncompressed for clarity in order to better illustrate the relative sizing and over travel according to exemplary embodiments. Notably, the amount of over travel for either or both of the electrically-conductive members 114, 214 may be more or less than what is shown in FIG. 13 depending, for example, on the particular application and/or printed circuit board or other substrate for which the EMI shielding assembly will be used. In addition, the substrate 112 shown in FIG. 13 may have a thickness of about one millimeter, which is typical for the industry. But the EMI shields disclosed herein may be used with a wide range of electronic components and packages (e.g., integrated circuits mounted on a printed circuit board, etc.) including substrates having a thickness greater or less than one millimeter. Accordingly, the dimensions, relative sizing, and extent of over travel shown in FIG. 13 are provided herein are for purposes of illustration only, as the EMI shielding assembly and components thereof may be configured with different dimensions and relative sizes depending, for example, on the particular application, such as the components to be shielded, space considerations within the overall apparatus, EMI shielding and heat dissipation needs, and other factors.

In addition, some embodiments may include electrically-conductive molded elastomer having a generally uniform or symmetric cross-sectional profile. Alternatively, other embodiments may include electrically-conductive molded elastomer having a non-uniform or non-symmetric cross-sectional profile.

In some embodiments, the cross-sectional mid-plane of the electrically-conductive molded portion may be co-incident with the mid-plane of a PCB trace. Other embodiments, however, may include electrically conductive molded portions configured such that their cross-sectional mid-planes are not co-incident with a PCB trace.

Some embodiments include electrically-conductive elastomer that forms ribs or sections along the interior of a cover depending on the shielding requirements. For example, various embodiments include one or more components disposed along (e.g., overmolded, molded to, attached, dispensed onto, adhesively bonded to, etc.) an interior portion of a cover, such as resilient partitioning members or partitioning ribs, electrically-conductive elastomer, thermal interface materials (e.g., thermally-conductive compliant material, etc.), etc. Alternative embodiments may include electrically-conductive elastomer only along the perimeter of the cover without any electrically-conductive members extending across the interior of the cover.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An EMI shield for a substrate having at least one electrical component disposed thereon, the EMI shield comprising:
    a cover having at least a first protrusion and a second protrusion spaced apart from the first protrusion to allow for positioning of the first and second protrusions respectively along generally opposite first and second sides of the substrate;
    at least one resilient electrically-conductive member disposed along an inner side of the cover, and configured to be compressed generally between the substrate and the cover when at least a portion of the substrate is captured generally between the at least one resilient electrically-conductive member and the first protrusion;
    the second protrusion operable as a stop for inhibiting relative movement of the cover towards the substrate beyond a predetermined amount to thereby help prevent over-compression of the at least one resilient electrically-conductive member when the substrate contacts the second protrusion;
    whereby engagement of the first protrusion with the substrate and compression of the at least one resilient electrically-conductive member generates a compressive clamping force for mechanically retaining the cover to the substrate, and for compressing the at least one resilient electrically-conductive member against at least one electrically-conductive surface disposed on the substrate, to establish electrical conductivity therebetween that is sufficient for EMI shielding performance.

2. The EMI shield of claim 1, wherein the at least one resilient electrically-conductive member intervenes between one or more areas partitioned by the at least one resilient electrically-conductive member, to provide for an attenuation of transfer of electromagnetic energy from the one or more partitioned areas that is sufficient for EMI shielding applications.

3. The EMI shield of claim 1, wherein the at least one resilient electrically-conductive member comprises silicone-based elastomer and electrically-conductive particles dispersed within the silicone-based elastomer.

4. The EMI shield of claim 1, wherein the electrical conductivity established by the at least one resilient electrically-conductive member between the cover and the at least one electrically-conductive surface is at least a minimal level sufficient for EMI shielding applications.

5. The EMI shield of claim 1, wherein the at least one resilient electrically-conductive member has a cross-section that increases in width from a free end portion to a base portion coupled to the cover.

6. The EMI shield of claim 1, wherein the at least one resilient electrically-conductive member is at least one or more of molded onto the cover or adhesively bonded to the cover.

7. The EMI shield of claim 1, wherein the at least one resilient electrically-conductive member provides an area of contact with the at least one electrically-conductive surface and provides an electrical impedance between the at least one electrically-conductive surface and the cover that is sufficient for EMI shielding applications.

8. The EMI shield of claim 1, wherein the cover comprises first and second covers for respectively shielding electrical components disposed on first and second sides of the substrate.

9. The EMI shield of claim 1, further comprising a plurality of EMI shielding compartments configured for covering a plurality of electrical components disposed on the substrate.

10. The EMI shield of claim 9, wherein the at least one resilient electrically-conductive member defines at least a portion of at least one of the EMI shielding compartments.

11. The EMI shield of claim 1, wherein the substrate includes generally opposite first and second sides defining a thickness therebetween, and wherein the first and second protrusions are spaced apart a distance greater than the thickness to thereby allow the first and second protrusions to be respectively positioned along the substrate's first and second sides.

12. An electronic device including the EMI shield of claim 1, a printed circuit board having electrical components on generally opposite first and second sides of the printed circuit board, wherein the cover comprises first and second covers for shielding the electrical components on the respective first and second sides of the substrate.

13. The EMI shield of claim 1, wherein the cover is removably attachable to the substrate.

14. The EMI shield of claim 1, wherein the EMI shield is mechanically retained to the substrate without any frame.

15. The EMI shield of claim 1, wherein the EMI shield is mechanically retained to the substrate solely by the compressive clamping force generated by engagement of the first protrusion with the substrate and compression of the at least one resilient electrically-conductive member caused thereby.

16. The EMI shield of claim 1, wherein the cover includes a generally planar portion, and at least one tab downwardly depending relative to the generally planar portion, the at least one tab having the first and second protrusions and configured for extending across a thickness defined between the substrate's first and second sides to thereby allow positioning of the second protrusion on a side of the substrate opposite that of the generally planar portion.

17. The assembly of claim 16, wherein the at least one tab includes at least one camming surface for urging the tab outwardly to thereby facilitating the positioning of the second protrusion on the substrate's side opposite that of the generally planar portion.

18. The EMI shield of claim 1, wherein the first and second protrusions comprise inwardly extending half-dimples defining detents configured for engagement with the substrate.

* * * * *